(12) United States Patent
Kawahara

(10) Patent No.: US 10,903,620 B2
(45) Date of Patent: Jan. 26, 2021

(54) SEMICONDUCTOR DEVICE, AND METHOD FOR MANUFACTURING SEMICONDUCTOR DEVICE

(71) Applicant: Mitsubishi Electric Corporation, Tokyo (JP)

(72) Inventor: Hiroyuki Kawahara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/490,664

(22) PCT Filed: May 19, 2017

(86) PCT No.: PCT/JP2017/018842
§ 371 (c)(1),
(2) Date: Sep. 3, 2019

(87) PCT Pub. No.: WO2018/211689
PCT Pub. Date: Nov. 22, 2018

(65) Prior Publication Data
US 2020/0067262 A1   Feb. 27, 2020

(51) Int. Cl.
*H01S 5/026* (2006.01)
*H01S 5/34* (2006.01)
*H01S 5/343* (2006.01)

(52) U.S. Cl.
CPC ............ *H01S 5/026* (2013.01); *H01S 5/3413* (2013.01); *H01S 5/34313* (2013.01)

(58) Field of Classification Search
CPC ..... H01S 5/026; H01S 5/3413; H01S 5/34313
See application file for complete search history.

(56) References Cited

U.S. PATENT DOCUMENTS 5,612,550 A * 3/1997 Gomyo .................. B82Y 10/00
257/184

FOREIGN PATENT DOCUMENTS

| JP | H06-268325 A | 9/1994 |
| JP | 2002-169131 A | 6/2002 |
| JP | 2010-165759 A | 7/2010 |

OTHER PUBLICATIONS

International Search Report; Written Opinion; and Notification of Transmittal of the International Search Report and the Written Opinion of the International Searching Authority, or the Declaration issued in PCT/JP2017/018842; dated Aug. 1, 2017.
An Office Action mailed by the State Intellectual Property Office of the People's Republic of China dated Aug. 28, 2020, which corresponds to Chinese Patent Application No. 201780090807.0 and is related to U.S. Appl. No. 16/490,664; with English language translation.

* cited by examiner

*Primary Examiner* — Armando Rodriguez
(74) *Attorney, Agent, or Firm* — Studebaker & Brackett PC

(57) ABSTRACT

There are included: a substrate; a semiconductor laser part formed on the substrate by stacking a plurality of layers including an active layer; and an adjacent part formed on the substrate by stacking a plurality of layers including a core layer, and being an optical modulator or an optical waveguide in contact with the semiconductor laser part through butt joint joining thereto. In a semiconductor device including the semiconductor laser part and the adjacent part which are joined in a butt joint manner, at least a portion, of the semiconductor laser part, that is contact with the adjacent part is disordered.

16 Claims, 8 Drawing Sheets

SEMICONDUCTOR DEVICE, AND METHOD FOR MANUFACTURING SEMICONDUCTOR DEVICE

FIELD

This invention relates to a semiconductor device having a semiconductor laser part, and an optical modulator or an optical waveguide on a single substrate, and a method for manufacturing the semiconductor device.

BACKGROUND

Use of semiconductor laser devices in which an optical modulator or an optical waveguide is integrated is increasing due to a request for large-capacity optical communication networks. An optical device in which a plurality of functions are integrated needs different crystal structures for the individual functions. As a method for producing such an optical device, repetition of partial etching using an insulating film mask and regrowth is often employed.

Patent Literature 1 discloses that a butt joint technology is one of techniques for integrating, on a semiconductor substrate, a plurality of optical devices such as a semiconductor laser and an optical modulator. Patent Literature 1 also discloses that the butt joint technology is a technology of joining a plurality of optical devices in a butt joint manner on a single substrate with their optical axes aligned.

PRIOR ART

Patent Literature

Patent Literature 1: JP 2010-1657.59 A

SUMMARY

Technical Problem

There is considered a case where an optical modulator or an optical waveguide is formed through butt joint growth in the state where a plurality of crystal layers different in composition, such, for example, as an active layer and a cladding layer, are exposed on a lateral surface. In this case, since the butt joint growth is performed on the complex lateral surface in which the compositions, lattice constants and the like of those are locally different, crystal quality of a portion on the lateral surface of the butt joint growth layer results in deteriorating. Such deterioration in crystal quality of the portion on the lateral surface of the butt joint growth layer leads to deterioration in initial characteristics or reliability of the device.

In particular, when a strained active layer is used as the active layer, the butt joint growth means crystal growth performed on its lateral surface the strain on which periodically changes. In this case, crystal quality of the portion on the lateral surface of the butt joint growth layer significantly deteriorates.

Moreover, another problem on integrated devices is that carriers injected into the active layer reach the butt joint interface through a well layer, and the carriers concentrate at the butt joint part. Such concentration of carriers decreases reliability of the semiconductor device.

The present invention is devised in order to solve the aforementioned problems, and an object thereof is to provide a semiconductor device capable of suppressing characteristics of the semiconductor device in which a plurality of portions different in function are joined from deteriorating, and a method for manufacturing the semiconductor device.

Means for Solving the Problems

A semiconductor device according to this invention includes a substrate, a semiconductor laser part formed on the substrate and having an active layer, and an adjacent part formed on the substrate, having a core layer, and being an optical modulator or an optical waveguide in contact with the semiconductor laser part, wherein a portion, of the semiconductor laser part, that is in contact with the adjacent part is disordered.

A method for manufacturing a semiconductor device according to this invention includes a step of forming a semiconductor laser part having an active layer on a substrate, a step of forming, on the substrate, an adjacent part which is an optical modulator or an optical waveguide which is joined to the semiconductor laser part in a butt joint manner, and a disordering step of disordering a portion, of the semiconductor laser part, that is in contact with the adjacent part and a portion, of the adjacent part, that is in contact with the semiconductor laser part.

A method for manufacturing another semiconductor device according to this invention includes a step of forming a multilayer structure having an active layer, a disordering step of disordering a part of the multilayer structure, a removing step of removing a part of a disordered portion out of the multilayer structure, and thereby, forming a semiconductor laser part which has a not-disordered portion and a disordered part which is disordered and on a lateral surface of which the disordered part is exposed, and a step of forming, on the substrate, an adjacent part which is an optical modulator or an optical waveguide which is joined to the semiconductor laser part in a butt joint manner.

Other features will be disclosed below.

Advantageous Effects of Invention

According to this invention, a part of joining in a butt joint manner is disordered, and thereby, characteristics of a semiconductor device in which a plurality of portions different in function have undergone such joining can be suppressed from deteriorating.

DESCRIPTION OF EMBODIMENTS

Semiconductor devices and methods for manufacturing a semiconductor device according to embodiments are described with reference to the drawings. The same or corresponding components are given the same signs and their duplicate description is occasionally omitted.

Embodiment 1

Figure 1:
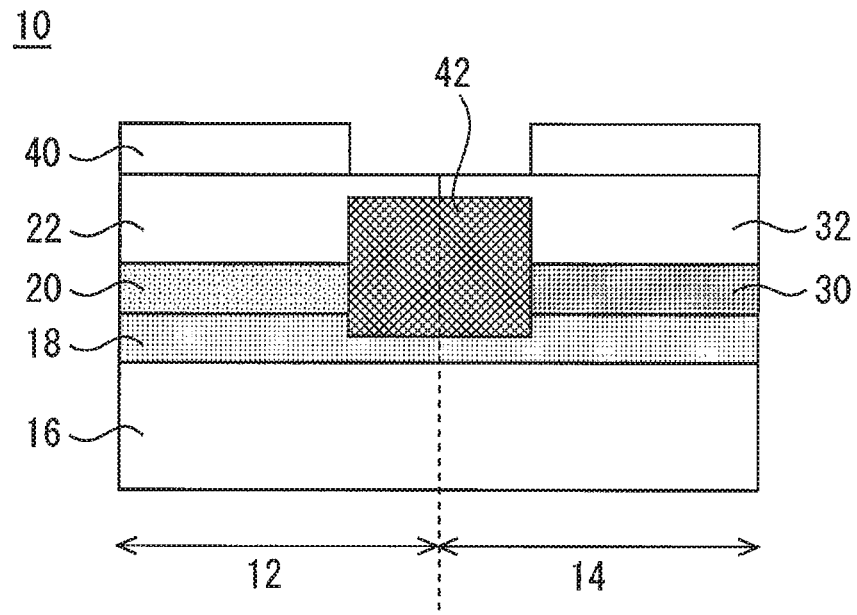
FIG. 1 is a cross-sectional view of a semiconductor device according to Embodiment 1.

FIG. 1 is a cross-sectional view of a semiconductor device 10 according to Embodiment 1. The semiconductor device 10 forms a ridge-type optical integrated device in which a semiconductor laser part 12 and an adjacent part 14 composed of an EA (Electro-Absorption modulator are integrated. The adjacent part 14 can be an optical modulator or an optical waveguide other than the EA modulator. The broken line indicates the boundary between the semiconductor laser part 12 and the adjacent part 14.

The semiconductor device 10 includes a substrate 16 formed, for example, of n-type InP, A lower cladding layer 18 formed, for example, of n-type InP is provided on the substrate 16. On the lower cladding layer 18, an active layer 20 is formed in the semiconductor laser part 12, and a core layer 30 is formed in the adjacent part 14. Both the active layer 20 and the core layer 30 take InGaAsP multiple quantum well (MQW) structures. The active layer 20 and the core layer 30 are connected together in a butt joint manner. The active layer 20 may take a structure in which the MQW structure is sandwiched between an upper SCH (Separated Confinement Heterostructure) layer and a lower SCH layer. The SCH layer is an InGaAsP separated confinement heterolayer. Likewise, the core layer 30 may have two SCH layers.

A first upper cladding layer 22 formed, for example, of p-type InP is provided on the active layer 20. A second upper cladding layer 32 formed, for example, of p-type InP is provided on the core layer 30. The first upper cladding layer 22 is provided in the semiconductor laser part 12, and the second upper cladding layer 32 is provided in the adjacent part 14. A contact layer 40, for example, with p-type InGaAs being as its material is formed on the first upper cladding layer 22 and the second upper cladding layer 32.

The semiconductor laser part 12 includes the lower cladding layer 18, the active layer 20 and the first upper cladding layer 22. The adjacent part 14 includes the lower cladding layer 18, the core layer 30 and the second upper cladding layer 32. As above, the semiconductor laser part 12, and the adjacent part 14 in contact with the semiconductor laser part 12 are formed on the substrate 16.

A portion, of the semiconductor laser part 12, that is in contact with the adjacent part 14 is disordered. A portion, of the adjacent part 14, that is in contact with the semiconductor laser part 12 is disordered. These disordered portions form a disordered part 42, The disordered part 42 is formed in a portion including the boundary between the semiconductor laser part 12 and the adjacent part 14 to be shared by both the semiconductor laser part 12 and the adjacent part 14. The disordered part 42 is a portion the bandgap of which is expanded by disordering the multiple quantum well structure. Accordingly, the disordered portion of the active layer 20 is larger in bandgap than the not-disordered portion of the active layer 20. Moreover; the disordered portion of the core layer 30 is larger in bandgap than the not-disordered portion of the core layer 30. The disordered portions are transparent to laser oscillation light.

Figure 2:
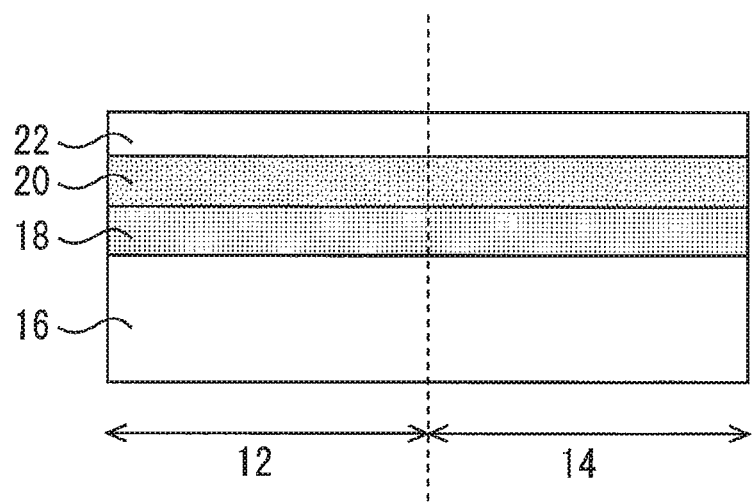
FIG. 2 is a cross-sectional view of the semiconductor device after the epitaxial growth.

A method for manufacturing the semiconductor device 10 according to Embodiment 1 is described. While the adjacent part 14 is an optical modulator or an optical waveguide, here is described a case where the adjacent part 14 is composed of an optical waveguide. On the substrate 16 formed of n-type InP, first, the lower cladding layer 18 is formed, and after that, the active layer 20 and the first upper cladding layer 22 are sequentially epitaxially grown. FIG. 2 is a cross-sectional view of the semiconductor device after the epitaxial growth. The lower cladding layer 18 is n-type InP, the active layer 20 is an InGaAsP multiple quantum well structure, and the first upper cladding layer 22 is p-type InP. The left side from the broken line is the portion to be the semiconductor laser part 12, and the right side from the broken line is the portion to be the adjacent part 14.

Figure 3:
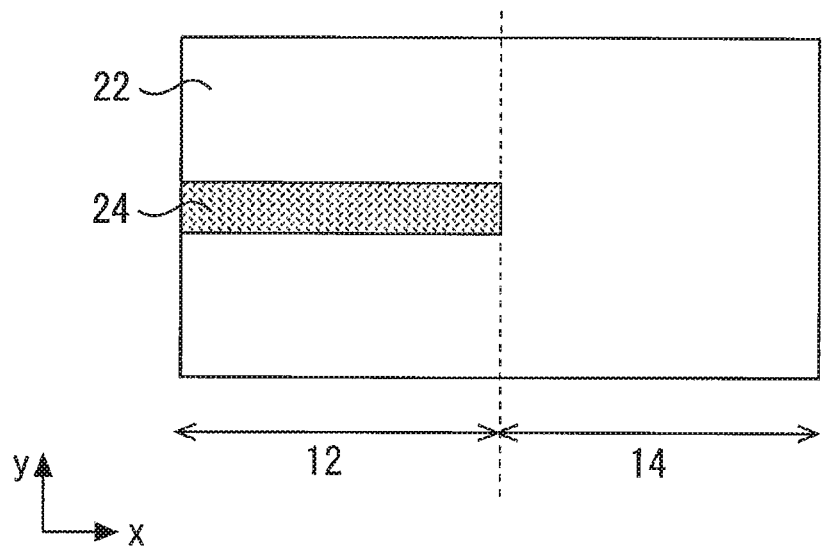
FIG. 3 is a plan view illustrating a mask.

Next, a mask is formed. FIG. 3 is a plan view illustrating a mask 24. The mask 24 is formed into a stripe shape on the first upper cladding layer 22 in the semiconductor laser part 12. The material of the mask 24 is, for example, SiO$_2$. The pattern of the mask 24 is formed, for example, by photoetching using a resist pattern.

Figure 4:
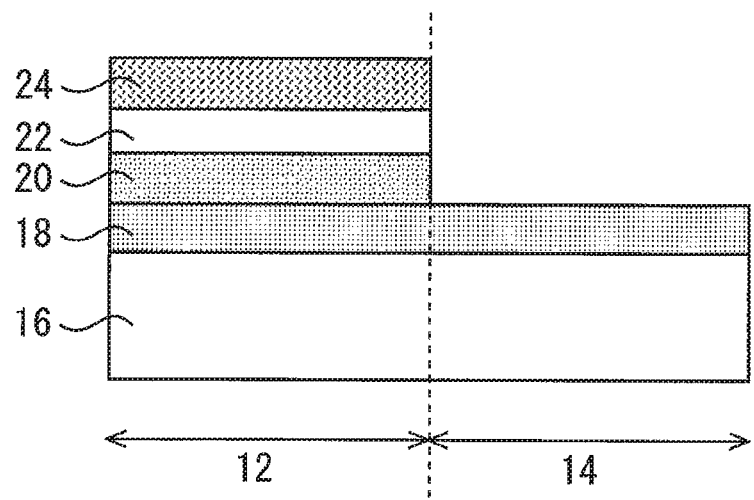
FIG. 4 is a cross-sectional view of the semiconductor device after the etching.

Next, etching processing is performed. FIG. 4 is a cross-sectional view of the semiconductor device after the etching. The portion not covered by the mask 24 is etched to the middle of the active layer 20 by dry etching such as RIE. Furthermore, the remaining portion of the active layer 20 is etched by etching using a liquid chemical with an etching selectivity between InGaAsP and InP, such as tartaric acid. Thereby, the lower cladding layer 18 is exposed. The lower cladding layer 18 may be exposed by another method. Thus, the semiconductor laser part 12 having the active layer 20 is formed on the substrate 16.

Figure 5:
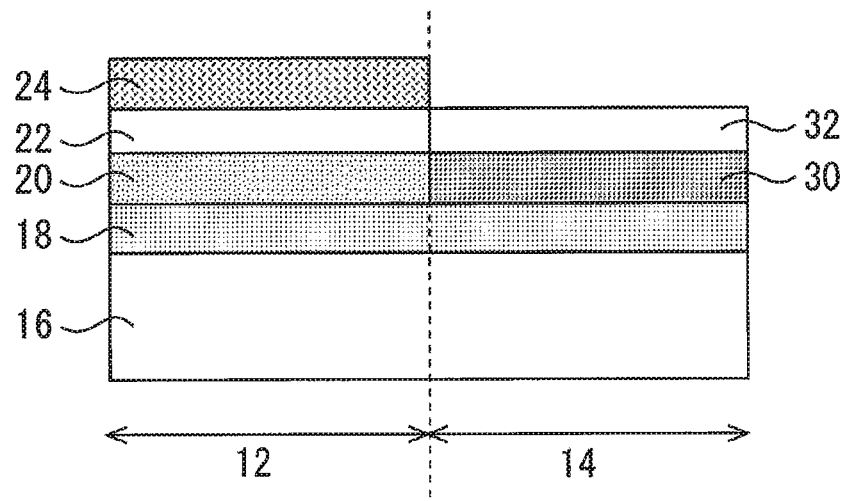
FIG. 5 is a cross-sectional view illustrating the adjacent part.

Next, the adjacent part 14 is formed. FIG. 5 is a cross-sectional view illustrating the adjacent part 14. In this step, the core layer 30 and the second upper cladding layer 32 are sequentially epitaxially grown. Thereby, on the lower cladding layer 18 in the adjacent part 14, the core layer 30 is formed, and on the core layer 30, the second upper cladding layer 32 is formed. This growth is called butt joint growth. This butt joint growth forms, on the substrate 16, the adjacent part 14 which is joined to the semiconductor laser part 12 in a butt joint manner.

Figure 6:
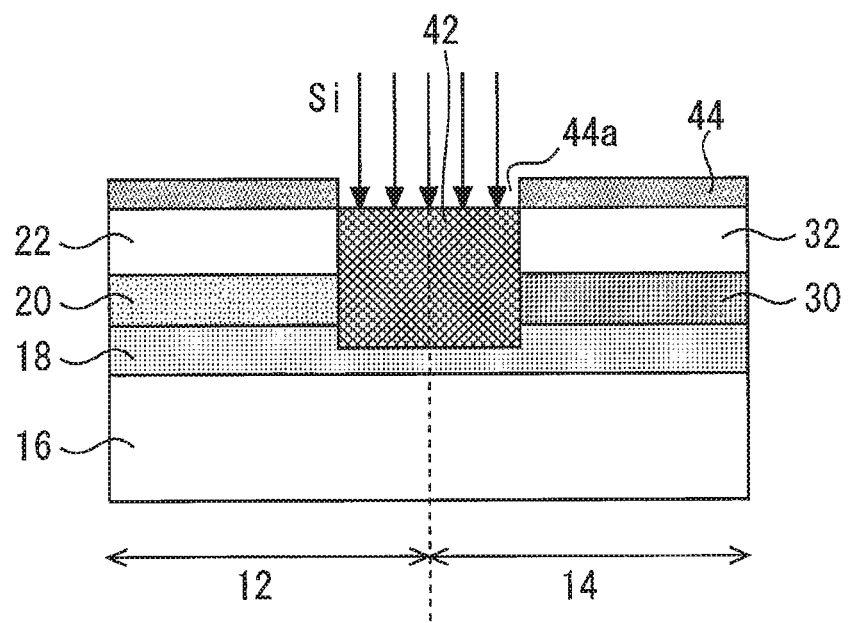
FIG. 6 is a cross-sectional view illustrating an implantation mask and the disordered portion.

Next, the mask 24 is removed, for example, with hydrofluoric acid. After the mask 24 is removed, the first upper cladding layer 22 and the second upper cladding layer 32 are exposed on the surface. Next, an implantation mask is formed. FIG. 6 is a cross-sectional view illustrating an implantation mask 44. The implantation mask 44 is formed on the first upper cladding layer 22 and the second upper cladding layer 32. The implantation mask 44 has an opening 44a on a butt joint part. The opening 44a is shared by both the semiconductor laser part 12 and the adjacent part 14.

Next, the portion, of the semiconductor laser part 12, that is in contact with the adjacent part 14 and the portion, of the adjacent part 14, that is in contact with the semiconductor laser part 12 are disordered. This step is called a disordering step. FIG. 6 is a diagram for explaining processing in the disordering step. In the disordering step, an impurity is implanted into the semiconductor laser part 12 and the adjacent part 14 through the opening 44a of the implantation mask 44. After impurity ions are implanted, thermal annealing is performed, FIG. 6 illustrates formation of the disordered part 42 by disordering parts of the semiconductor laser part 12 and the adjacent part 14 by implanting Si ions from the upper surface side and performing the thermal annealing.

The disordered part 42 reaches, in the semiconductor laser part 12, the middle of the lower cladding layer 18 from the upper surface of the first upper cladding layer 22, and reaches, in the adjacent part 14, the middle of the lower cladding layer 18 from the upper surface of the second upper cladding layer 32. The bottom surface of the disordered part 42 is above the lower surface of the lower cladding layer 18. The bottom surface of the disordered part 42 may be below the lower surface of the lower cladding layer 18, which forms the disordered part 42 also into the substrate 16. The disordering step disorders a portion, of the active layer 20, that is in contact with the adjacent part 14 and a portion, of the core layer 30, that is in contact with the semiconductor laser part 12.

In the disordering step, a layer which is a diffusion source may be right above the boundary between the first upper cladding layer 22 and the second upper cladding layer 32, followed by diffusion of the impurity from the layer and thermal annealing after that to form the disordered part 42.

Next, the implantation mask 44 is removed, for example, with hydrofluoric acid, and film forming processing is performed, Specifically, a cladding layer with p-type InP being as its material is additionally grown, thereby, to thicken the first upper cladding layer 22 and the second upper cladding layer 32. After that, the contact layer 40 is grown on the first upper cladding layer 22 and the second upper cladding layer 32, In the contact layer 40, an opening is preferably formed from which the boundary portion between the semiconductor laser part 12 and the adjacent part 14 is exposed. The material of the contact layer 40 is, for example, p-type InGaAs. The additional growth of the first upper cladding layer 22 and the second upper cladding layer 32 and the growth of the contact layer 40 afford the sectional structure in FIG. 1.

Figure 7:
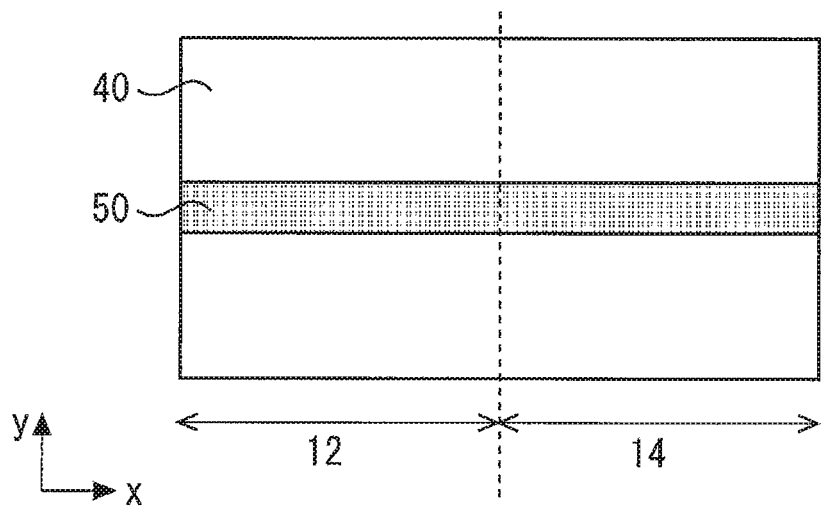
FIG. 7 is a plan view illustrating a mask.

Next, a mask is formed which coincides with the planar shape of a ridge. FIG. 7 is a plan view illustrating a mask 50. The mask 50 is a SiO$_2$ film formed, for example, by photoetching using a resist pattern.

Next, the portion exposed from the mask 50 is etched with the mask 50 being as the mask. For example, the contact layer 40, the first upper cladding layer 22 and the second upper cladding layer 32 are etched by dry etching such as RIE. Next, the mask 50 is removed using hydrofluoric acid, and thereby, a basic crystal structure of the semiconductor device 10 illustrated in FIG. 1 is completed. Each step so far is a step for disordering a part of a structure in which the active layer 20 and the core layer 30 are provided on the substrate 16 to be adjacent to each other. A process other than the aforementioned process may be employed as long as the basic crystal structure illustrated in FIG. 1 is finally completed.

Figure 8:
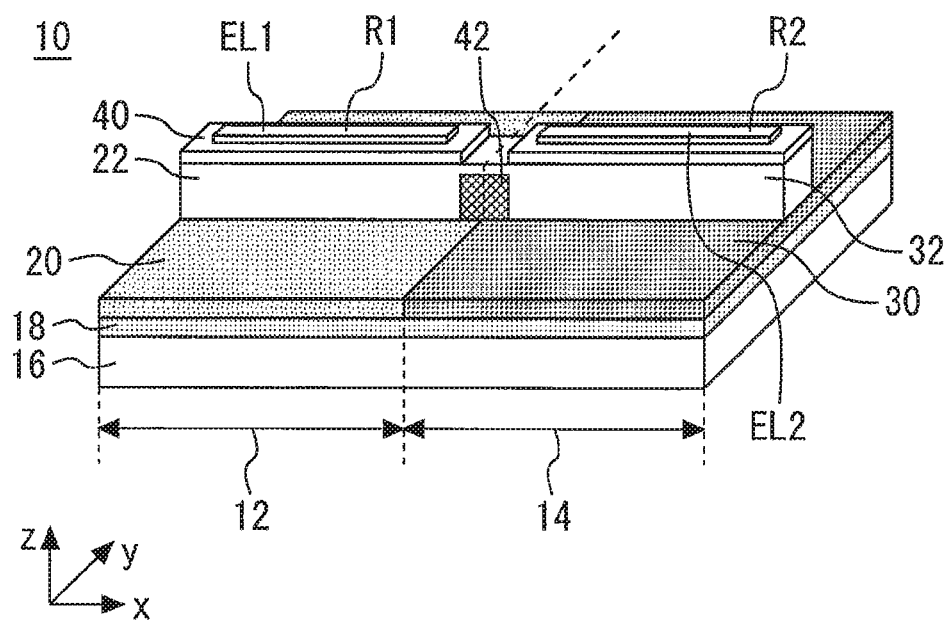
FIG. 8 is a perspective view of the semiconductor device in which the electrodes are formed.

Next, electrodes are formed in the basic crystal structure. FIG. 8 is a perspective view of the semiconductor device in which the electrodes are formed. A first ridge structure R1 of the semiconductor laser part 12 and a second ridge structure R2 of the adjacent part 14 are connected together in a butt joint manner. An electrode EL1 is formed on the contact layer 40 in the semiconductor laser part 12. An electrode EL2 is formed on the contact layer 40 in the adjacent part 14. A portion including the boundary between the semiconductor laser part 12 and the adjacent part 14 is occasionally called a passive waveguide. By not providing the contact layer 40 on this passive waveguide, isolation between the semiconductor laser part 12 and the adjacent part 14 can be enhanced. Notably, if such enhancement of the isolation is not needed, the contact layer 40 may be provided also on the passive waveguide.

A plurality of layers different in physical properties are exposed on the lateral surface of the semiconductor laser part 12. Crystal quality of a portion on the lateral surface of the adjacent part 14 obtained through butt joint growth in contact with that lateral surface is to deteriorate. With the semiconductor device according to Embodiment 1, the portion, of the adjacent part 14, that is in contact with the semiconductor laser part 12 however is disordered. Hence, this portion is transparent to laser oscillation light. Therefore, characteristics of the semiconductor device can be suppressed from deteriorating.

Moreover, the active layer 20 may be a strained active layer. The strained active layer is an active layer in which layers different in strain are periodically provided typically at intervals of nanometers. The strained active layer is provided for purposes such as improvement of optical output. When the strained active layer is used as the active layer 20, crystal quality of the portion on the lateral surface of the adjacent part 14 significantly deteriorates. Hence, by disordering the relevant portion on the lateral surface, characteristics of the semiconductor device can be suppressed from significantly deteriorating.

Furthermore, by disordering the portion, of the semiconductor laser part 12, that is in contact with the adjacent part 14, carriers injected into the active layer 20 can be suppressed from reaching the butt joint interface through the multiple quantum well structure. Accordingly, such carriers can be suppressed from concentrating at the butt joint interface, and reliability of the semiconductor device can be suppressed from deteriorating.

As above, with the semiconductor device 10 and the method for manufacturing the semiconductor device 10 according to Embodiment 1, by forming the disordered part 42, randomness in crystallinity is recovered. The length of the disordered part 42 in the resonator direction which is the x-direction in FIG. 8 is preferably shortened to avoiding the semiconductor device from being upsized.

The semiconductor device 10 and the method for manufacturing the semiconductor device 10 according to Embodiment 1 can be modified in various manners without their features impaired. The semiconductor device 10 is a waveguide-integrated semiconductor laser device. In other words, an optical waveguide is joined to the semiconductor laser part 12 in a butt joint manner. Meanwhile, also with an optical modulator-integrated semiconductor laser device in which an optical modulator is joined to the semiconductor laser part 12 in a butt joint manner, the aforementioned effect can be obtained by forming a disordered part.

Moreover, layers not mentioned above may be added to the semiconductor laser part 12 and the adjacent part 14. For example, a diffraction grating layer may be provided in the semiconductor laser part 12. In order to realize the optimum waveguide width, the widths of the first ridge structure R1 and the second ridge structure R2 may be different. The ridge height of the first ridge structure R1 and the ridge height of the second ridge structure R2 may be different. For example, the active layer 20 is provided in the whole semiconductor laser part 12, and the core layer 30 is provided only in the second ridge structure R2. This causes the first ridge structure R1 to have a smaller z-directional length than that of the second ridge structure R2. Additional growth of the first upper cladding layer 22 and the second upper cladding layer 32 may be omitted if not necessary.

Such modifications described for Embodiment 1 can also be applied to a semiconductor device and a method for manufacturing a semiconductor device according to the following embodiment. Notably, the semiconductor device and the method for manufacturing a semiconductor device according to the following embodiment and those according to Embodiment 1 have many matters in common, and hence, their differences from those in Embodiment 1 are mainly described.

Embodiment 2

Figure 9:
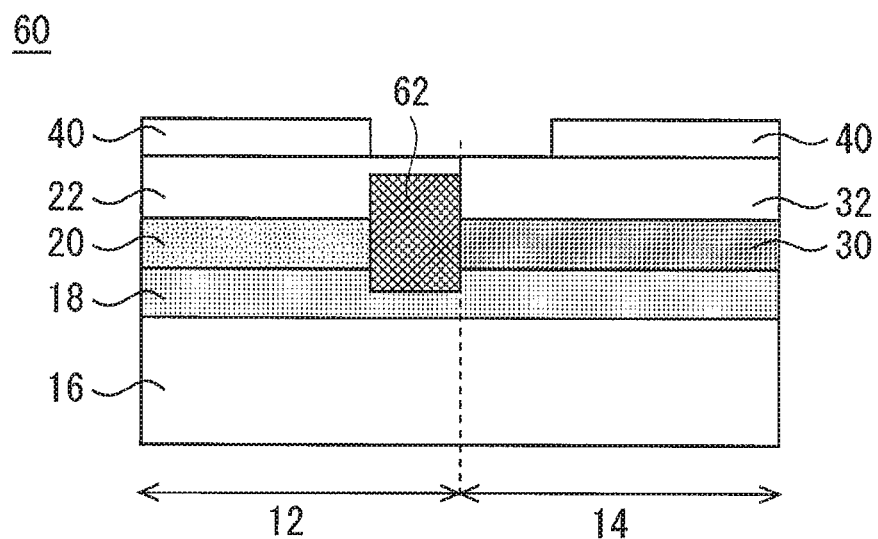
FIG. 9 is a cross-sectional view of a semiconductor device according to Embodiment 2.

FIG. 9 is a cross-sectional view of a semiconductor device 60 according to Embodiment 2. A portion, of the semiconductor laser part 12, that is in contact with the adjacent part 14 is a disordered part 62 which is disordered. Meanwhile, any portion, of the adjacent part 14, that is in contact with the semiconductor laser part 12 is not disordered. In other words, the disordered part 62 is formed only in the semiconductor laser part 12.

Figure 10:
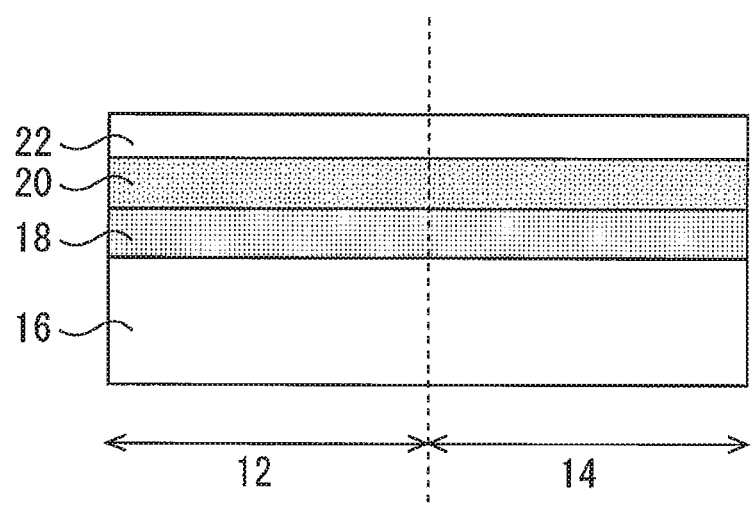
FIG. 10 is a cross-sectional view illustrating the multilayer structure having the active layer.

A method for manufacturing the semiconductor device 60 is described. First, a multilayer structure having the active layer 20 is formed on the substrate 16. FIG. 10 is a cross-sectional view illustrating the multilayer structure having the active layer 20. While the multilayer structure includes the lower cladding layer 18, the active layer 20 and the first upper cladding layer 22, another layer may be added thereto as needed. The multilayer structure is preferably formed in the whole portion in which the semiconductor laser part 12 and the adjacent part 14 are formed.

Figure 11:
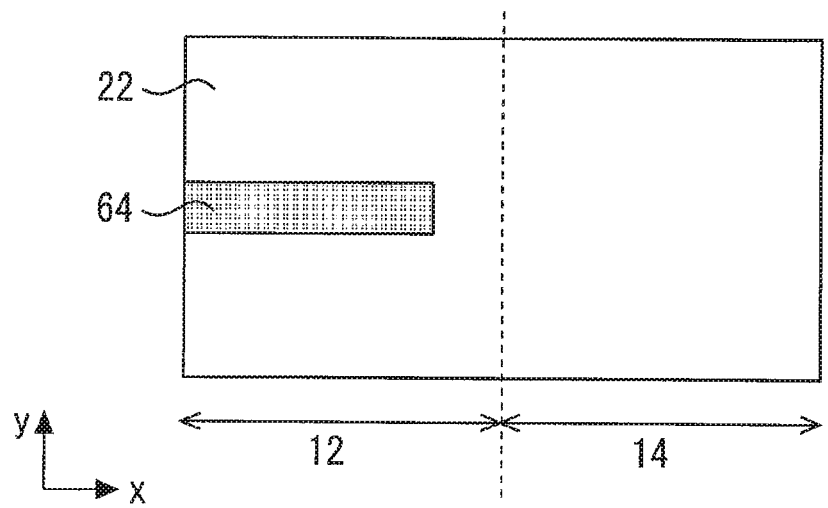
FIG. 11 is a plan view of an implantation mask.

Next, a part of the multilayer structure is disordered. This step is called the disordering step. In the disordering step, first, an implantation mask is formed. FIG. 11 is a plan view of an implantation mask 64. The implantation mask 64 is formed into a stripe shape on a portion to be the semiconductor laser part 12. The implantation mask 64 is not formed at the boundary between the semiconductor laser part 12 and the adjacent part 14. Therefore, the implantation mask 64 and the boundary are separate from each other at a predefined distance.

Figure 12:
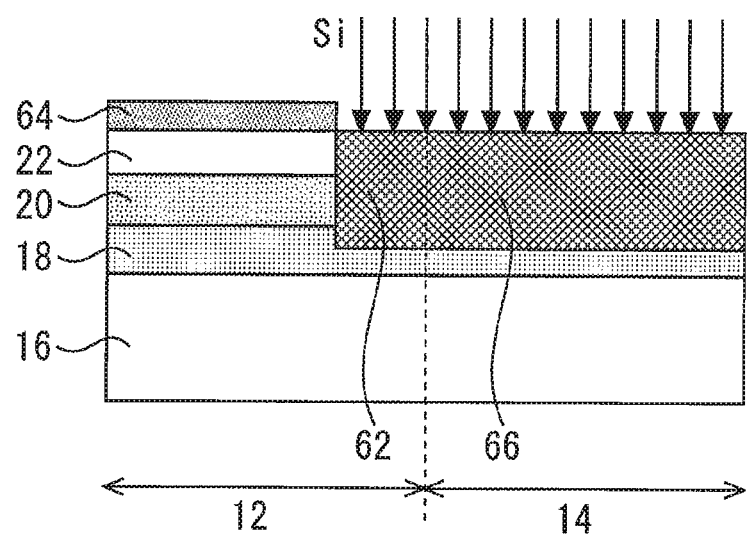
FIG. 12 is a cross-sectional view of an implantation mask and the disordered portion.

After the implantation mask 64 is formed, an impurity is implanted into the portions, of the semiconductor laser part 12 and the adjacent part 14, which are exposed from the implantation mask 64. After impurity ions are implanted, thermal annealing is performed. FIG. 12 illustrates formation of the disordered part 62 in a part of the semiconductor laser part 12 and formation of a disordered part 66 in the adjacent part 14 by implanting Si ions from the upper surface side and performing the thermal annealing. In the disordering step, the disordered part 66 is formed in the whole adjacent part 14 in plan view.

Figure 13:
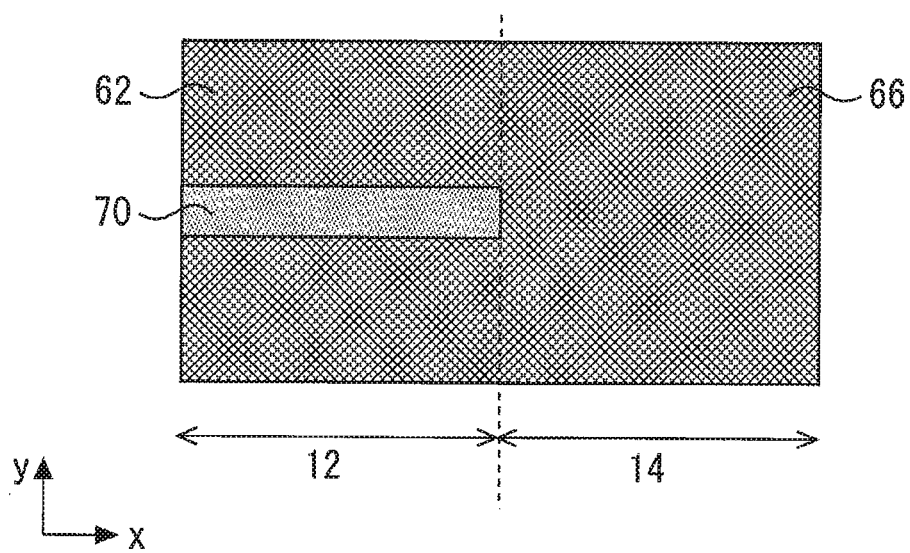
FIG. 13 is a plan view of a new mask.

Next, after the implantation mask 64 is removed, a new mask is formed. FIG. 13 is a plan view of a new mask 70. The mask 70 is formed into a stripe shape on the semiconductor laser part 12. The mask 70 reaches the boundary between the semiconductor laser part 12 and the adjacent part 14. Notably, the materials of the implantation mask 64 and the mask 70 are, for example, $SiO_2$.

Next, a part of the disordered portion out of the multilayer structure is removed with the mask 70 being as a mask. This step is called the removing step. In the removing step, the disordered parts 62 and 66 that are exposed from the mask 70 are removed to expose the lower cladding layer 18. A method of removing the disordered parts 62 and 66 that are exposed from the mask 70 is not specially limited. For example, they are preferably etched to the middle of the active layer 20 by dry etching, followed by performing selective etching in which an etching rate with respect to the active layer 20 is higher than an etching rate with respect to the lower cladding layer 18 which is the lower layer under the active layer 20. The dry etching is, for example, RIE, and the selective etching is etching with, for example, tartaric acid. Since the adjacent part 14 is disordered, the etching depth in the etching with tartaric acid can be made uniform. In other words, the upper surface of the exposed lower cladding layer 18 can be made flat. Moreover, by improving crystallinity by disordering, side etching during wet etching can be suppressed. Since the aforementioned effect can be obtained by removing the disordered portion in the removing step, only the disordered portion of the multilayer structure is preferably removed in the removing step.

Figure 14:
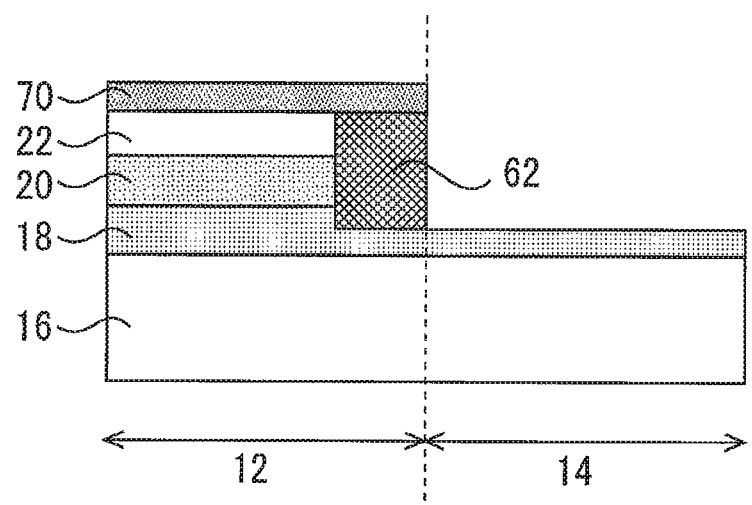
FIG. 14 is a cross-sectional view of the semiconductor device after the removing step.

FIG. 14 is a cross-sectional view of the semiconductor device after the removing step. By removing a part of the disordered part 62 and the whole disordered part 66 in the removing step, the semiconductor laser part 12 having a not-disordered portion and a disordered portion is formed. The disordered portion is the disordered part 62. In the removing step, the disordered part 62 is exposed on the lateral surface of the semiconductor laser part 12.

Next, the adjacent part 14 is formed. Specifically, butt joint growth is performed to form the adjacent part 14 in contact with the semiconductor laser part 12. The adjacent part 14 is an optical modulator or an optical waveguide joined to the semiconductor laser part 12 in a butt joint manner. Since the disordered part 62 which is disordered is formed on the lateral surface of the semiconductor laser part 12, the portion on the lateral surface of the semiconductor laser part 12 is stably crystalline. Therefore, crystallinity of the portion, of the adjacent part 14, that is in contact with the semiconductor laser part 12 can be improved.

Next, the mask 70 is removed, the first upper cladding layer 22 and the second upper cladding layer 32 are additionally grown, and the contact layer 40 is formed. Next, the mask 50 illustrated in FIG. 7 is formed. Furthermore, the contact layer 40, the first upper cladding layer 22 and the second upper cladding layer 32 exposed from the mask 50 are etched, for example, by dry etching. Next, the mask 50 is removed using hydrofluoric acid. Thus, a basic crystal structure of the semiconductor device 60 illustrated in FIG. 9 is completed.

Figure 15:
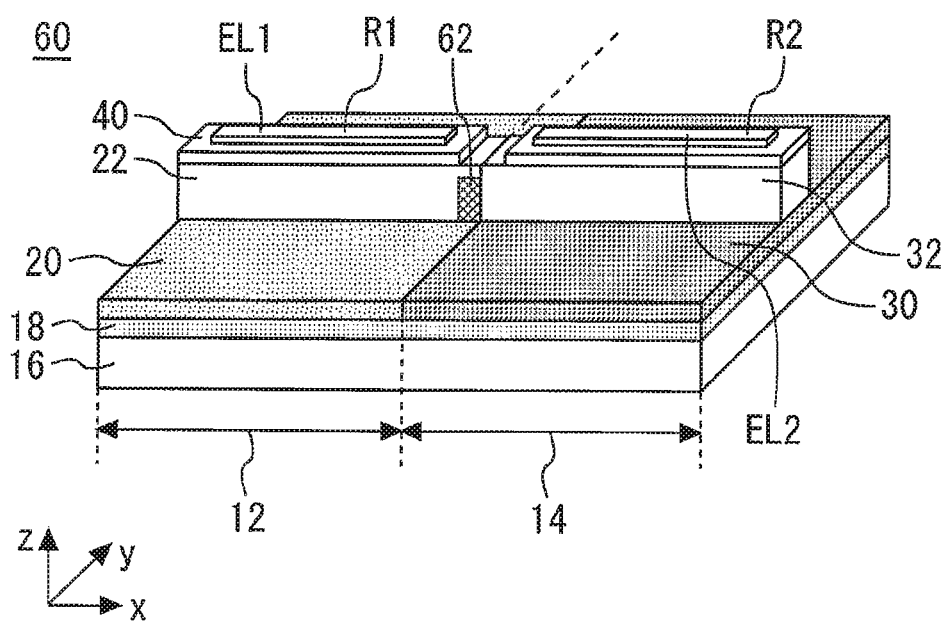
FIG. 15 is a perspective view of the semiconductor device in which the electrodes are formed.

After that, electrodes are formed in the basic crystal structure. FIG. 15 is a perspective view of the semiconductor device 60 in which the electrodes are formed. The first ridge structure R1 of the semiconductor laser part 12 and the second ridge structure R2 of the adjacent part 14 are connected together in a butt joint manner. The electrode EL1 is formed on the contact layer 40 in the semiconductor laser part 12. The electrode EL2 is formed on the contact layer 40 in the adjacent part 14. By not providing the contact layer 40 on the passive waveguide, isolation between the semiconductor laser part 12 and the adjacent part 14 can be enhanced.

While in Embodiment 1, disordering is performed after butt joint growth, disordering is performed before butt joint growth in Embodiment 2. Therefore, the adjacent part 14 can undergo butt joint growth with respect to the semiconductor laser part 12 which exposes, from its lateral surface, the disordered part the crystal composition of which is stable. Accordingly, crystal quality of the portion, of the adjacent part 14, that is in contact with the semiconductor laser part 12 can be suppressed from deteriorating.

DESCRIPTION OF SYMBOLS 10 semiconductor device, 12 semiconductor laser part, 14 adjacent part, 42,62 disordered part

The invention claimed is:

1. A semiconductor device comprising:
a substrate;
a semiconductor laser part formed on the substrate and having an active layer; and
an adjacent part formed on the substrate, having a core layer, and being an optical modulator or an optical waveguide in contact with the semiconductor laser part, wherein
a portion, of the semiconductor laser part, that is in contact with the adjacent part is disordered, and
a portion, of the adjacent part, that is in contact with the semiconductor laser part is disordered.

2. The semiconductor device according to claim 1, comprising
a lower cladding layer formed under the active layer and the core layer, wherein
a portion, of the active layer, that is in contact with the adjacent part is disordered,
a portion, of the core layer, that is in contact with the semiconductor laser part is disordered, and
bottom surfaces of the disordered portions are above a lower surface of the lower cladding layer.

3. A method for manufacturing a semiconductor device, comprising:
forming a semiconductor laser part having an active layer on a substrate;
forming, on the substrate, an adjacent part which is an optical modulator or an optical waveguide which is joined to the semiconductor laser part in a butt joint manner; and
disordering a portion, of the semiconductor laser part, that is in contact with the adjacent part and a portion, of the adjacent part, that is in contact with the semiconductor laser part.

4. A method for manufacturing a semiconductor device, comprising:
forming a multilayer structure having an active layer on a substrate;
disordering a part of the multilayer structure;
removing a part of a disordered portion out of the multilayer structure, and thereby, forming a semiconductor laser part which has a not-disordered portion and a disordered part which is disordered and on a lateral surface of which the disordered part is exposed; and
forming, on the substrate, an adjacent part which is an optical modulator or an optical waveguide which is joined to the semiconductor laser part in a butt joint manner.

5. The method for manufacturing a semiconductor device according to claim 4, wherein in removing the part of the disordered portion, only the disordered portion out of the multilayer structure is etched to a middle of the active layer by dry etching, and next, selective etching is performed in which an etching rate with respect to the active layer is higher than an etching rate with respect to a lower layer under the active layer.

6. The method for manufacturing a semiconductor device according to claim 3, wherein in the disordering, disordering through impurity implantation is performed.

7. The method for manufacturing a semiconductor device according to claim 3, wherein in the disordering, disordering through impurity diffusion is performed.

8. The method for manufacturing a semiconductor device according to claim 3, wherein the active layer is a strained active layer.

9. The method for manufacturing a semiconductor device according to claim 4, wherein in the disordering, disordering through impurity implantation is performed.

10. The method for manufacturing a semiconductor device according to claim 4, wherein in the disordering, disordering through impurity diffusion is performed.

11. The method for manufacturing a semiconductor device according to claim 4, wherein the active layer is a strained active layer.

12. The method for manufacturing a semiconductor device according to claim 5, wherein in the disordering, disordering through impurity implantation is performed.

13. The method for manufacturing a semiconductor device according to claim 5, wherein in the disordering, disordering through impurity diffusion is performed.

14. The method for manufacturing a semiconductor device according to claim 5, wherein the active layer is a strained active layer.

15. The method for manufacturing a semiconductor device according to claim 6, wherein the active layer is a strained active layer.

16. The method for manufacturing a semiconductor device according to claim 7, wherein the active layer is a strained active layer.

* * * * *